United States Patent
Perrenoud

(10) Patent No.: US 11,641,001 B2
(45) Date of Patent: May 2, 2023

(54) FLEXIBLE PHOTOVOLTAIC APPARATUS WITH MULTI-LAYERED SUBSTRATE

(71) Applicant: FLISOM AG, Niederhasli (CH)

(72) Inventor: Julian Christoph Perrenoud, Seengen (CH)

(73) Assignee: FLISOM AG, Niederhasli (CH)

( * ) Notice: Subject to any disclaimer, the term of this patent is extended or adjusted under 35 U.S.C. 154(b) by 831 days.

(21) Appl. No.: 16/081,406

(22) PCT Filed: Feb. 24, 2017

(86) PCT No.: PCT/IB2017/000181
§ 371 (c)(1),
(2) Date: Aug. 30, 2018

(87) PCT Pub. No.: WO2017/149376
PCT Pub. Date: Sep. 8, 2017

(65) Prior Publication Data
US 2021/0202774 A1 Jul. 1, 2021

Related U.S. Application Data

(60) Provisional application No. 62/302,792, filed on Mar. 2, 2016.

(51) Int. Cl.
*H01L 31/05* (2014.01)
*H01L 31/0392* (2006.01)
(Continued)

(52) U.S. Cl.
CPC ...... *H01L 31/0516* (2013.01); *C23C 14/0641* (2013.01); *C23C 14/20* (2013.01);
(Continued)

(58) Field of Classification Search
CPC ......... H01L 31/03926; H01L 31/03928; H01L 31/0445–0468; H01L 31/0512; H01L 31/0516
See application file for complete search history.

(56) References Cited

U.S. PATENT DOCUMENTS

2004/0253807 A1\* 12/2004 Thei .................. H01L 21/76849
257/E21.585
2006/0183327 A1\* 8/2006 Moon ............... H01L 21/76856
438/687
(Continued)

FOREIGN PATENT DOCUMENTS

KR 20140148312 A 12/2014

OTHER PUBLICATIONS

Blösch, P. et al. "Optimization of Ti/TiN/Mo back contact properties for Cu(In,Ga)Se2 solar cells on polyimide foils," Thin Solid Films, vol. 519, No. 21, Dec. 31, 2010, pp. 7453-7457.

*Primary Examiner* — Andrew J Golden
(74) *Attorney, Agent, or Firm* — Patterson & Sheridan, LLP

(57) ABSTRACT

Embodiments of the present disclosure generally relate to flexible photovoltaic modules that include a multi-layered substrate. In some embodiments, the multi-layered substrate includes one or more layers that are configured to improve the elastic modulus, rigidity, or stiffness of a flexible substrate of a flexible photovoltaic module during a deposition process step at an elevated temperature that is used to form the flexible photovoltaic module. The one or more layers of the multi-layered substrate may also provide improved barrier properties that prevent environmental contaminants from affecting the performance of a formed photovoltaic module, which includes the multi-layered substrate, during normal operation.

14 Claims, 5 Drawing Sheets

(51) Int. Cl.
  *C23C 14/06* (2006.01)
  *C23C 14/20* (2006.01)
  *C23C 14/34* (2006.01)
  *H01L 31/18* (2006.01)

(52) U.S. Cl.
  CPC ........ *C23C 14/34* (2013.01); *H01L 31/03928* (2013.01); *H01L 31/0512* (2013.01); *H01L 31/18* (2013.01)

(56) References Cited

U.S. PATENT DOCUMENTS

| | | | |
|---|---|---|---|
| 2010/0319757 A1* | 12/2010 | Getting | H01L 31/0392 136/252 |
| 2011/0086462 A1* | 4/2011 | Ovshinsky | H01L 31/0463 257/E31.127 |
| 2012/0006398 A1 | 1/2012 | Nguyen et al. | |
| 2013/0178060 A1* | 7/2013 | De Vries | H01L 31/0392 438/653 |
| 2015/0136209 A1 | 5/2015 | Hattori et al. | |
| 2016/0056314 A1 | 2/2016 | Woods et al. | |

\* cited by examiner

FLEXIBLE PHOTOVOLTAIC APPARATUS WITH MULTI-LAYERED SUBSTRATE

BACKGROUND

Field

Embodiments of the present disclosure generally relate to flexible photovoltaic apparatuses.

Description of the Related Art

Photovoltaic apparatuses have conventionally employed a rigid layer of crystalline silicon as the active photovoltaic layer in the apparatus. More recently, thin-film photovoltaic apparatuses having photovoltaic layers which allow the apparatus to be formed into a roll (e.g., apparatus has roll-ability), such as thin (~2 micron) layers of $Cu(In,Ga)Se_2$ semiconductor also known as CIGS, have been developed to compete with conventional photovoltaic apparatuses. The photovoltaic layers, such as CIGS, can be formed on flexible substrates, such as metal foils, flexible glass, or polyimide.

Polyimide is often chosen as a substrate material due to its flexibility, durability, insulating properties, and because monolithic interconnections can be formed on polyimide substrates. The flexibility of polyimide enables absorber layers, such as CIGS layers, to be processed using a roll-to-roll process in which the polyimide substrate is unwound from a first roll, the precursor elements (e.g., Cu, In, Ga, and Se) are deposited onto the polyimide substrate, and then the roll including the deposited material is wound up into a second roll. During the roll-to-roll process, temperatures greater than 300° C. are often used to heat the precursor elements to facilitate the deposition of the precursor elements onto the polyimide substrate.

Despite the benefits of using polyimide as the substrate for a flexible photovoltaic apparatus, temperatures greater than 300° C. can reduce the elastic modulus of the polyimide substrate and cause the polyimide substrate to become softer. The reduced elastic modulus and increased softness of polyimide at temperatures greater than 300° C. can make it difficult to deposit absorber layers (e.g., CIGS layers) on polyimide substrates at temperatures greater than 300° C. without causing cracks in the metallic back contact and/or the absorber layer. Therefore, there is a need to protect the absorber layer from micro cracking during deposition at temperatures above 300° C., and also during subsequent rolling and handling type processing steps.

SUMMARY

Embodiments of the present disclosure generally relate to flexible photovoltaic apparatuses including multi-layered substrates and methods of forming such apparatuses. In one embodiment, a photovoltaic apparatus is provided including a photovoltaic device that includes an array of photovoltaic cells, each photovoltaic cell comprising a back-contact layer, a front-contact layer, and an absorber layer disposed between the front-contact layer and the back-contact layer. The photovoltaic apparatus further includes a multi-layered substrate that includes a base layer formed of a polymer, the base layer having a front surface facing the photovoltaic device and an opposing back surface facing away from the photovoltaic device, wherein the photovoltaic device is disposed over the front surface of the multi-layered substrate, and one or more metallic layers, wherein the base layer is disposed between the photovoltaic device and at least one of the one or more metallic layers.

In another embodiment, a method of forming a photovoltaic apparatus is provided. The method includes forming a multi-layered substrate by depositing one or more metallic layers onto a base layer formed of a polymer, the base layer having a front surface and an opposing back surface, wherein depositing one or more metallic layers onto the base layer comprises depositing a first layer onto the back surface of the base layer; forming a back-contact layer over the multi-layered substrate, wherein the front surface of the base layer faces the back-contact layer; forming an absorber layer over the back-contact layer; and forming a front-contact layer over the absorber layer.

In another embodiment, a multi-layered substrate is provided including a base layer formed of a polymer, the base layer having a front surface and an opposing back surface. The multi-layered substrate further includes a first layer disposed on the back surface of the base layer; a second layer disposed on the first layer; a third layer disposed on the second layer; a fourth layer disposed on the front surface of the base layer; a fifth layer disposed on the fourth layer; and a sixth layer disposed on the fifth layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to flexible photovoltaic modules that include a multi-layered substrate. In some embodiments, the multi-layered substrate includes one or more layers that are configured to improve the elastic modulus, rigidity, or stiffness of a flexible substrate of a flexible photovoltaic module during a deposition process step that is used to form the flexible photovoltaic module. The one or more layers of the multi-layered substrate may also provide improved barrier properties that prevent environmental contaminants from affecting the performance of a formed photovoltaic module, which includes the multi-layered substrate, during normal operation. The one or more layers can include one or more metallic layers. The one or more layers of the multi-layered substrate can also help reduce the amount of shrinkage of a polymer layer (e.g., polyimide) used in the multi-layered substrate as well as the occurrence of cracks or other deformations in other layers of the photovoltaic module formed during handling or normal use of the photovoltaic module, such as the absorber layer within the photovoltaic module. The reduction in occurrences of shrinkage of the polymer layer can help maintain alignment between the substrate and the photovoltaic device formed on the substrate during subsequent processing, such as laser scribing to form the individual photovoltaic cells. The reduction of cracks and other deformations in the other layers of the photovoltaic module can result in increased yield, device lifetime and efficiency, as well as reliability of the photovoltaic module.

Figure 1A:
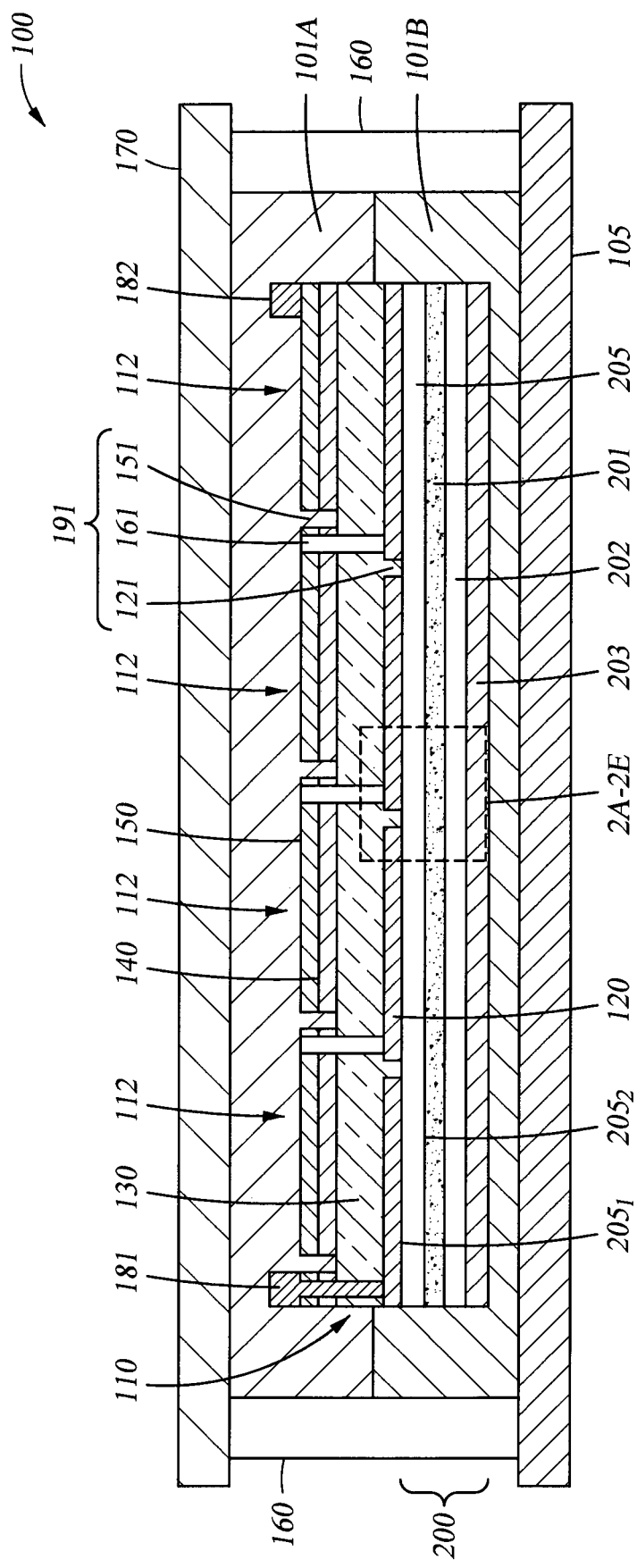
FIG. 1A is a side cross sectional view of a photovoltaic apparatus, according to one embodiment.
Figure 1B:
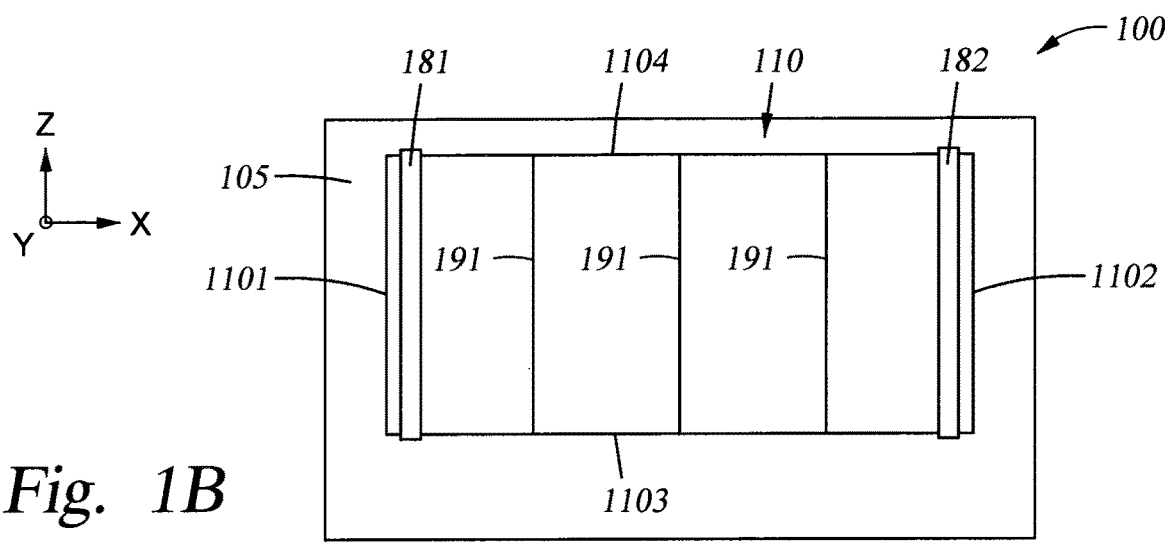
FIG. 1B is a top view of a portion of the photovoltaic apparatus of FIG. 1A, according to one embodiment.

FIG. 1A is a side cross sectional view of a photovoltaic apparatus 100, according to one embodiment. FIG. 1B is a top view of a portion of the photovoltaic apparatus 100. The top view of the photovoltaic apparatus 100 illustrated in FIG. 1B is shown without a front sheet 170, an edge seal 160, a front-side adhesive 101A, and a back-side adhesive 101B (all described below) to give a clearer view of the arrangement of layers and components in the photovoltaic apparatus 100. The photovoltaic apparatus 100 may include multiple optoelectronic devices, such as photovoltaic devices (e.g., solar cells), diodes, and LEDs. The views in FIG. 1A and FIG. 1B of the photovoltaic apparatus 100 are shown including one photovoltaic device 110, however, more photovoltaic devices 110 may be included in other embodiments.

Each photovoltaic device 110 is formed on a multi-layered substrate 200. In some embodiments, each photovoltaic device 110 may include a plurality of thin-film layers that are deposited on the multi-layered substrate 200, and then patterned (e.g., scribed) to form a plurality of monolithically interconnected photovoltaic cells 112 that are electrically connected in series in an array. The array extends in the X-direction (first direction) from a first end 1101 of the photovoltaic device 110 to a second end 1102 of the photovoltaic device 110. Each photovoltaic cell 112 extends in the Y-direction from a first side 1103 of the photovoltaic device 110 to a second side 1104 of the photovoltaic device 110. In some embodiments, the photovoltaic device 110 can include a photovoltaic device formed on another substrate that is then positioned on the multi-layered substrate 200.

Each photovoltaic device 110 can be formed of, for example, a back-contact layer 120 formed on the multi-layered substrate 200, an absorber layer 130 formed over the back-contact layer 120, and a front-contact layer 150 formed over the absorber layer 130. The back-contact layer 120 can be fabricated from a material having a high optical reflectance to help improve light collection by the photovoltaic device 110. The back-contact layer 120 can include a conductive material such as molybdenum (Mo), although several other thin-film materials, such as metal chalcogenides, molybdenum chalcogenides, molybdenum selenides (such as MoSe2), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer 120 include a material that has a high optical reflectance within a desired wavelength range, such as a range between 1.03 µm and 1.24 µm. In some embodiments, the back-contact layer 120 is deposited onto the multi-layered substrate 200 by use of a sputtering process.

The absorber layer 130 is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the $Cu(In,Ga)Se_2$ semiconductor also known as CIGS. In some embodiments, the absorber layer 130 may be a polycrystalline material. In other embodiments, the absorber layer 130 may be a monocrystalline material. The absorber layer 130 can also have a chalcopyrite structure, for example a CIGS layer with a chalcopyrite structure. In other embodiments, the absorber layer 130 can be formed of other semiconductor materials, such as cadmium tellurium (CdTe), cadmium selenium (CdSe), other Group II-VI semiconductors, or mixtures thereof.

The front-contact layer 150 can be an electrically conductive and optically transparent material, such as a transparent conductive oxide (TCO) layer. For example, in some embodiments, the front-contact layer 150 may be formed of doped or non-doped variations of materials, such as indium oxides, tin oxides, or zinc oxides.

In some embodiments, a semiconductive buffer layer 140 can be disposed between the absorber layer 130 and the front-contact layer 150. The semiconductive buffer layer 140 ordinarily has an energy bandgap higher than 1.5 eV. The semiconductive buffer layer 140 may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

A first busbar 181 forms an electrical connection to the photovoltaic device 110, such as to the back-contact layer 120 through a connection region of the front-contact layer 150 of the photovoltaic device 110 that is coupled to the back-contact layer 120. The first busbar 181 may be a conductive material that forms the cathode of the photovoltaic device 110. In some embodiments, the first busbar 181 may be formed of a flexible material. The busbars described herein may also be referred to as conductors.

A second busbar 182 forms an electrical connection to the photovoltaic device 110, such as to the front-contact layer 150 of the photovoltaic device 110. The second busbar 182 may be a conductive material that forms the anode of the photovoltaic device 110. In some embodiments, the second busbar 182 may be formed of a flexible material.

A serial interconnect 191 forms an electrical connection between each adjacent photovoltaic cell 112. Each serial interconnect 191 includes a connecting groove 161 (i.e., P2 scribe line) that is formed through the front-contact layer 150, the semiconductive buffer layer 140 and the absorber layer 130 to form an electrically conductive path that electrically connects adjacent photovoltaic cells 112. The conductive path may be formed by melting a portion of the absorber layer 130 during a laser scribing process used to form the connecting groove 161. For example, one connecting groove 161 electrically connects the front-contact layer 150 of the third photovoltaic cell 112 shown in FIG. 1A to the back-contact layer 120 of the fourth photovoltaic cell 112 shown in FIG. 1A.

Each serial interconnect 191 includes a pair of grooves to electrically isolate portions of each adjacent photovoltaic cell 112. A back-contact groove 121 (i.e., P1 scribe line) electrically isolates back-contact layers 120 of adjacent photovoltaic cells 112 from each other. A front-contact groove 151 (i.e., P3 scribe line) electrically isolates front-contact layers 150 of adjacent photovoltaic cells 112 from each other. The serial interconnects 191 collectively electrically connect the photovoltaic cells 112 in the photovoltaic device 110 in series.

The photovoltaic device 110 is formed on the multi-layered substrate 200, as shown in FIG. 1A. The multi-layered substrate 200 includes a base layer 205. The base layer 205 can be formed of a flexible material, such as a flexible polymer, such as polyimide or polyether ketone. However, in some embodiments the base layer 205 can be formed of a different flexible material, such as a metallic layer, such as a metallic foil, such as a stainless steel foil. The base layer 205 includes a front surface $205_1$ facing the photovoltaic device 110 and an opposing back surface $205_2$ facing away from the photovoltaic device 110. The base layer 205 can have a thickness in the Z-direction from about 2 µm to about 200 µm, such as from about 5 µm to about 100 µm. The back-contact layer 120 can be formed on the front surface $205_1$ of the base layer 205.

The multi-layered substrate 200 may further include a first back-side layer 201 formed on the back surface $205_2$ of the base layer 205. The first back-side layer 201 can be formed of a metallic material, such as titanium, tungsten, tantalum, nickel, aluminum, copper, iron, or alloys thereof or combinations thereof. In some embodiments, the first back-side layer 201 can be formed of a nitride, such as silicon nitride, titanium nitride, or tantalum nitride. The first back-side layer 201 can have a thickness in the Z-direction from about 50 nm to about 1000 nm, such as from about 100 nm to about 500 nm.

The multi-layered substrate 200 can further include a second back-side layer 202 formed on the first back-side layer 201. For example, the second back-side layer 202 can be formed on the surface of the first back-side layer 201 facing away from the photovoltaic device 110. The second back-side layer 202 can be formed of a metallic material, such as titanium, tungsten, tantalum, nickel, aluminum, copper, iron, or alloys thereof or combinations thereof. In some embodiments, the second back-side layer 202 can be formed of a metallic nitride, such as a silicon nitride, titanium nitride, or tantalum nitride. The second back-side layer 202 can have a thickness in the Z-direction from about 50 nm to about 1000 nm, such as from about 100 nm to about 500 nm.

The multi-layered substrate 200 can further include a third back-side layer 203 formed on the second back-side layer 202. For example, the third back-side layer 203 can be formed on the surface of the second back-side layer 202 facing away from the photovoltaic device 110. The third back-side layer 203 can be formed of a metallic material, such as titanium, tungsten, tantalum, nickel, aluminum, or alloys thereof or combinations thereof. In some embodiments, the third back-side layer 203 can be formed of a metallic nitride, such as silicon nitride, titanium nitride or tantalum nitride. In some embodiments, the first back-side layer 201 and the third back-side layer 203 can be formed of a same material. The third back-side layer 203 can have a thickness in the Z-direction from about 50 nm to about 1000 nm, such as from about 100 nm to about 500 nm. The metallic layers of the multi-layered substrate 200 (i.e., layers 201-203) and the metallic layers of the multi-layered substrates 200A-200E (described below) can have a combined thickness in the Z-direction from about 0.5 µm to about 6 µm, such as from about 1 µm to about 3 µm. The metallic layers of the multi-layered substrate 200 (i.e., layers 201-203) and the metallic layers of the multi-layered substrates 200A-200E (described below) can be deposited on the base layer 205 using methods such as sputtering, reactive sputtering, chemical vapor deposition, and metal organic chemical vapor deposition.

Although different examples for the back-side layers 201-203 are described individually above, the following provide some exemplary combinations that can be used, wherein each combination is listed in the order of the first back-side layer 201, the second back-side layer 202, and then the third back-side layer 203. The examples include: (1) titanium, iron, titanium nitride; (2) iron, titanium, titanium nitride; (3) titanium nitride, titanium, titanium nitride; (4) copper, titanium, titanium nitride; and (5) copper, iron, titanium nitride.

The back-side layers 201-203 formed on the back surface $205_2$ of the multi-layered substrate 200 and the back-side layers of the multi-layered substrates 200A-200E (described below) can serve as an effective moisture barrier for the photovoltaic device 110. A moisture barrier on the back surface $205_2$ of the base layer 205 can prevent moisture from passing through the base layer 205 and through areas of the photovoltaic device 110 that are susceptible to moisture ingress, such as the back-contact groove 121, which is often scribed down to the front surface $205_1$ of the base layer 205. By integrating an effective moisture barrier into the multi-layered substrate it is possible to use less expensive and lighter encapsulation materials (e.g., the front-side adhesive 101A and the back-side adhesive 101B described below) allowing for a lightweight, reliable and cost effective photovoltaic apparatus.

The metallic layers 201-203 of the multi-layered substrate 200 and the metallic layers of the multi-layered substrates 200A-200E (described below) can also serve to increase the mechanical strength of the base layer 205 in the X-Y plane. The metallic 201-203 can increase the elastic modulus (E) of the base layer 205 at temperatures greater than 300° C. A base layer 205 having an increased elastic modulus can help prevent cracks from forming in the base layer 205 and prevent the often flexible base layer from distorting during portions of the production process carried out at temperatures greater than 300° C. (e.g., substrate temperatures up to 500° C.), such as deposition of the absorber layer 130. The formation of such cracks and excessive deformation of the substrate during processing have been known to cause shunts in the formed photovoltaic device, such as shunts between the back-contact layers 120 of adjacent photovoltaic cells 112 or between the front-contact layers 150 of adjacent photovoltaic cells 112, so the increased stiffness gained during processing by using the back-side layers 201-203 can be useful in preventing device failure.

When positioned within a photovoltaic apparatus 100, each photovoltaic device 110 may be encapsulated by use of a front-side adhesive 101A and a back-side adhesive 101B.

The front-side adhesive 101A can be formed over the front-contact layer 150 of the photovoltaic device 110. The front-side adhesive 101A may be formed of a flexible material, such as a flexible polymer. For example, in one embodiment the front-side adhesive 101A may be formed of a thermoplastic olefin (TPO) based polymer or a TPO blend.

The back-side adhesive 101B is disposed over the side of the multi-layered substrate 200 that is opposite to the side that the photovoltaic device 110 is formed. The back-side adhesive 101B may be formed of a flexible material, such as a flexible polymer. For example, in one embodiment the back-side adhesive 101B may be formed of a thermoplastic olefin-based polymer (TPO) or a TPO polymer blend. The back-side adhesive 101B may contact the front-side adhesive 101A and the adhesives 101A, 101B can completely surround and encapsulate the photovoltaic apparatus 100 to protect the photovoltaic device 110 from the external environment.

A front sheet 170 can be disposed on an outer surface of the front-side adhesive 101A, such as a top surface of the front-side adhesive 101A. The front sheet 170 can be formed of a transparent material, such as glass or a transparent thermoplastic polymer. In some embodiments, the front sheet 170 may be formed of a flexible material.

A back sheet 105 can be disposed on an outer surface of the back-side adhesive 101B, such as a bottom surface of the back-side adhesive 101B. The back sheet 105 may include a reflective material, such as a metal layer, a reflective polymer or a polymer with a reflective layer (e.g., metal foil). In some embodiments, the back sheet 105 may be formed of a rigid material. In other embodiments, the back sheet 105 may be formed of a flexible material. In some embodiments, a fiber-reinforced polymer may be used as the material for the back sheet 105. In still other embodiments, the back sheet 105 may be formed of glass material, or even of fabric material. Because the multi-layered substrate 200 and the multi-layered substrates 200A-200E described below can serve as an effective moisture barrier for the photovoltaic device 110 lighter and/or less expensive materials can be used as the material for the back sheet 105 than the materials that are traditionally used to form the back sheet 105. Examples of such lighter materials include polyethylene terephthalate (PET), polyvinylidene fluoride (PVDF), or copoylmers, such as fluoroethylene/vinyl ether (FEVE).

The photovoltaic device 110 can further include an optional edge seal 160 disposed around the edges of each photovoltaic device 110. The edge seal 160 can extend from an inner surface (e.g., top surface in FIG. 1A) of the back sheet 105 to an inner surface of the front sheet 170 (e.g., bottom surface in FIG. 1A). The presence of the edge seal 160 at the edge of the photovoltaic apparatus 100 can help assure that photovoltaic apparatus 100 can eliminate common photovoltaic apparatus manufacturing and photovoltaic device failure modes by preventing moisture and other substances from diffusing into the photovoltaic device 110. In some embodiments, the edge seal 160 can be formed over an outer surface of the front sheet 170 and/or the back sheet 105 to provide an even better seal against the external environment. In general, the edge seal 160 comprises a polymeric material, such as an elastomer, for example a butyl rubber or silicone material.

Figure 2A:
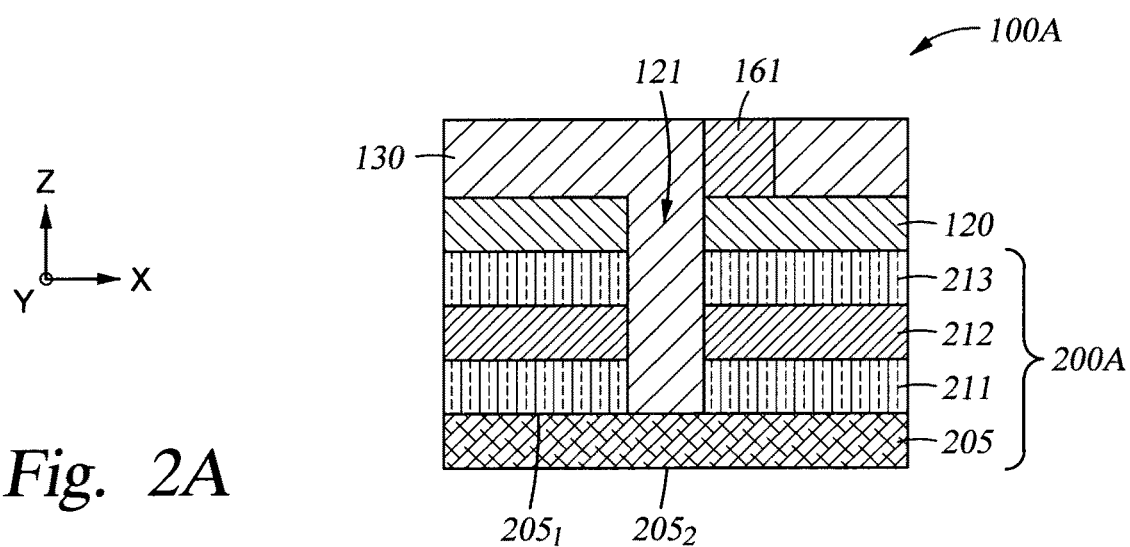
FIG. 2A is a partial cross sectional view of a photovoltaic apparatus, according to one embodiment.

FIG. 2A is a partial cross sectional view of a photovoltaic apparatus 100A, according to one embodiment. The photovoltaic apparatus 100A is similar to the photovoltaic apparatus 100 shown in FIG. 1A except that the photovoltaic apparatus 100A includes a multi-layered substrate 200A instead of the multi-layered substrate 200 described above. The dashed box 2A-2E shown in FIG. 1A provides an exemplary location for where the view shown in FIG. 2A could be taken on a photovoltaic apparatus including the multi-layered substrate 200A.

The multi-layered substrate 200A includes the base layer 205 described above. The multi-layered substrate 200A further includes a first front-side layer 211 formed on the front surface $205_1$ of the base layer 205. The first front-side layer 211 can be formed of a metallic material, such as titanium, tungsten, tantalum, nickel, aluminum, copper, iron, or alloys thereof or combinations thereof. In some embodiments, the first front-side layer 211 can be formed of a nitride, such as silicon nitride, titanium nitride, or tantalum nitride. The first front-side layer 211 can have a thickness in the Z-direction from about 50 nm to about 1000 nm, such as from about 100 nm to about 500 nm.

The multi-layered substrate 200A can further include a second front-side layer 212 formed on the first front-side layer 211. For example, the second front-side layer 212 can be formed on the surface of the first front-side layer 211 facing the back-contact layer 120. The second front-side layer 212 can be formed of a metallic material with a high elastic modulus (e.g., >100 GPa), such as a metallic nitride, such as a silicon nitride, titanium nitride, or tantalum nitride. In some embodiments, the second front-side layer 212 can be formed of titanium, tungsten, tantalum, nickel, aluminum, copper, iron, or alloys thereof or combinations thereof. The second front-side layer 212 can have a thickness in the Z-direction from about 50 nm to about 1000 nm, such as from about 100 nm to about 500 nm.

The multi-layered substrate 200A can further include a third front-side layer 213 formed on the second front-side layer 212. For example, the third front-side layer 213 can be formed on the surface of the second front-side layer 212 facing away from the back-contact layer 120. The third front-side layer 213 can be formed of a metallic material, such as titanium, tungsten, tantalum, nickel, aluminum, copper, iron, or alloys thereof or combinations thereof. In some embodiments, the third front-side layer 213 can be formed of a nitride, such as silicon nitride, titanium nitride, or tantalum nitride. In some embodiments, the first front-side layer 211 and the third front-side layer 213 can be formed of a same material. The third front-side layer 213 can have a thickness in the Z-direction from about 50 nm to about 1000 nm, such as from about 100 nm to about 500 nm. The back-contact layer 120 can be formed on the third front-side layer 213. For example, the back-contact layer 120 can be formed on the surface of the third front-side layer 213 facing away from the base layer 205.

The multi-layered substrate 200A does not include any metallic layers on the back surface $205_2$ of the base layer 205, which can provide a number of advantages. For example, the absence of metallic layers on the back surface $205_2$ of the base layer 205 can avoid the creation of a floating potential between the photovoltaic device 110 and the back sheet 105. The charge accumulated in floating potentials at various locations in a photovoltaic apparatus has been known to cause potential induced degradation, such as shunts. Furthermore, forming metallic layers only on the front surface $205_1$ of the base layer 205 can make production easier because the deposition of the photovoltaic device 110 can continue on the same side of the base layer 205 as the metallic layers. Additionally, the absence of metallic layers on the back surface $205_2$ allows for detection of the back-contact groove 121 (i.e., P1 scribe line) using illumination methods, which could not be used if one or more metallic layers was formed on the back surface $205_2$ of the base layer 205.

Figure 2B:
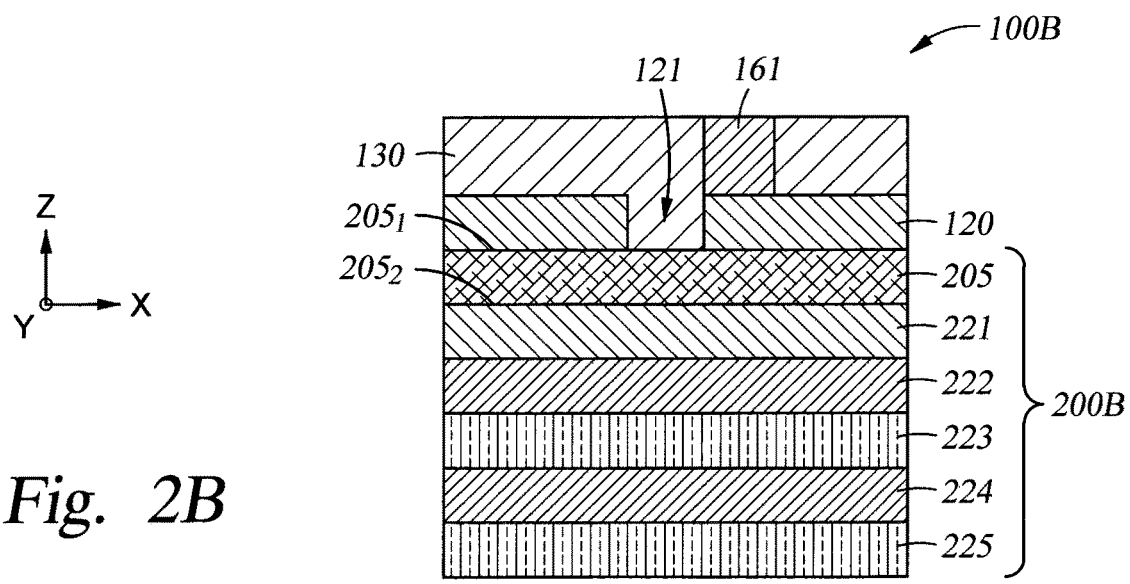
FIG. 2B is a partial cross sectional view of a photovoltaic apparatus, according to one embodiment.

FIG. 2B is a partial cross sectional view of a photovoltaic apparatus 100B, according to one embodiment. The photovoltaic apparatus 100B is similar to the photovoltaic apparatus 100 shown in FIG. 1A except that the photovoltaic apparatus 100B includes a multi-layered substrate 200B instead of the multi-layered substrate 200 described above. The dashed box 2A-2E shown in FIG. 1A provides an exemplary location for where the view shown in FIG. 2B could be taken on a photovoltaic apparatus including the multi-layered substrate 200B.

The multi-layered substrate 200B includes the base layer 205 described above. The multi-layered substrate 200B further includes a first back-side layer 221 formed on the back surface $205_2$ of the base layer 205. The first back-side layer 221 can be formed of a metallic material, such as titanium, tungsten, tantalum, nickel, aluminum, copper, iron, or alloys thereof or combinations thereof. In some embodiments, the first back-side layer 221 can be formed of a nitride, such as silicon nitride, titanium nitride, or tantalum nitride. The first back-side layer 221 can have a thickness in the Z-direction from about 50 nm to about 1000 nm, such as from about 100 nm to about 500 nm.

The multi-layered substrate 200B can further include a second back-side layer 222 formed on the first back-side layer 221. For example, the second back-side layer 222 can be formed on the surface of the first back-side layer 221 facing away from the back-contact layer 120. The second back-side layer 222 can be formed of a metallic material, such titanium, tungsten, tantalum, nickel, aluminum, copper, iron, or alloys thereof or combinations thereof. In some embodiments, the second back-side layer 222 can be formed of a nitride, such as silicon nitride, titanium nitride, or tantalum nitride. The second back-side layer 222 can have a thickness in the Z-direction from about 50 nm to about 1000 nm, such as from about 100 nm to about 500 nm.

The multi-layered substrate 200B can further include a third back-side layer 223 formed on the second back-side layer 222. For example, the third back-side layer 223 can be formed on the surface of the second back-side layer 222 facing away from the back-contact layer 120. The third back-side layer 223 can be formed of a metallic material, such as titanium, tungsten, tantalum, nickel, aluminum, copper, iron, or alloys thereof or combinations thereof. In some embodiments, the third back-side layer 223 can be formed of a nitride, such as silicon nitride, titanium nitride, or tantalum nitride. In some embodiments, the first back-side layer 221 and the third back-side layer 223 can be formed of a same material. The third back-side layer 223 can have a thickness in the Z-direction from about 50 nm to about 1000 nm, such as from about 100 nm to about 500 nm.

The multi-layered substrate 200B can further include a fourth back-side layer 224 formed on the third back-side layer 223. For example, the fourth back-side layer 224 can be formed on the surface of the third back-side layer 223 facing away from the back-contact layer 120. The fourth back-side layer 224 can be formed of a metallic material, such as a metallic nitride, such as a titanium nitride. In some embodiments, the second back-side layer 222 and the fourth back-side layer 224 can be formed of a same material. The fourth back-side layer 224 can have a thickness in the Z-direction from about 50 nm to about 1000 nm, such as from about 100 nm to about 500 nm.

The multi-layered substrate 200B can further include a fifth back-side layer 225 formed on the fourth back-side layer 224. For example, the fifth back-side layer 225 can be formed on the surface of the fourth back-side layer 224 facing away from the back-contact layer 120. The fifth back-side layer 225 can be formed of a metallic material, such as titanium. In some embodiments, the fifth back-side layer 225 can be formed of a metallic nitride, such as silicon nitride, titanium nitride, or tantalum nitride. In some embodiments, the fifth back-side layer 225 can be formed of a same material as one or more of the first back-side layer 221 and the third back-side layer 223. The fifth back-side layer 225 can have a thickness in the Z-direction from about 50 nm to about 1000 nm, such as from about 100 nm to about 500 nm. Because the metallic layers 221-225 are not scribed during the formation of the separate photovoltaic cells 112, the metallic layers 221-225 can form a continuous barrier against moisture or other contaminants. Furthermore, in some embodiments, the metallic layers 221-225 can be electrically connected to the back contact layer 120 of at least one of the photovoltaic cells 112 to prevent the metallic layers 221-225 from accumulating a floating potential. Furthermore, for metallic layers in the other multi-layered substrates described herein, any metallic layers on the back-side of the base layer 205 or metallic layers on the front-side of the base layer 205 that may be otherwise electrically floating, can be electrically connected to the back contact layer 120 of the at least one of the photovoltaic cells 112 to prevent occurrences of a floating potential at these layers and possible damage from that floating potential, such as potential induced degradation.

Figure 2C:
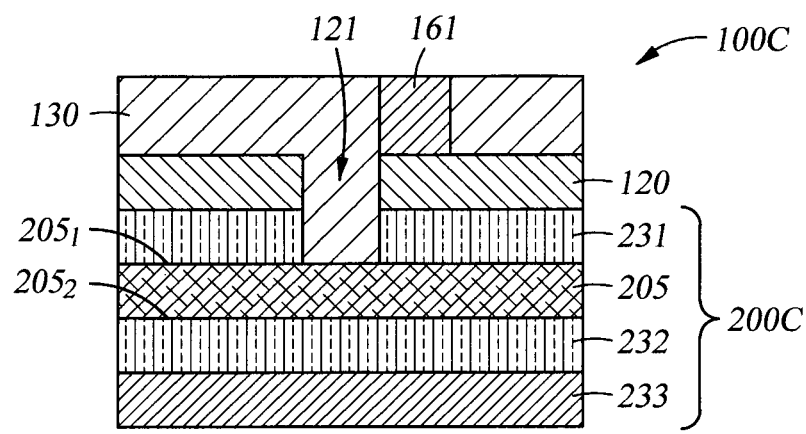
FIG. 2C is a partial cross sectional view of a photovoltaic apparatus, according to one embodiment.

FIG. 2C is a partial cross sectional view of a photovoltaic apparatus 100C, according to one embodiment. The photovoltaic apparatus 100C is similar to the photovoltaic apparatus 100 shown in FIG. 1A except that the photovoltaic apparatus 100C includes a multi-layered substrate 200C instead of the multi-layered substrate 200 described above. The dashed box 2A-2E shown in FIG. 1A provides an exemplary location for where the view shown in FIG. 2C could be taken on a photovoltaic apparatus including the multi-layered substrate 200C.

The multi-layered substrate 200C includes the base layer 205 described above. The multi-layered substrate 200C further includes a first front-side layer 231 formed on the front surface $205_1$ of the base layer 205. The first front-side layer 231 can be formed of a metallic material, such as titanium, tungsten, tantalum, nickel, iron, copper, aluminum, or alloys thereof or combinations thereof. In some embodiments, the first front-side layer 231 can be formed of a nitride, such as silicon nitride, titanium nitride, or tantalum nitride. The first front-side layer 231 can have a thickness in the Z-direction from about 50 nm to about 1000 nm, such as from about 100 nm to about 500 nm. The back-contact layer 120 can be formed on the first front-side layer 231. For example, the back-contact layer 120 can be formed on the surface of the first front-side layer 231 facing away from the base layer 205.

The multi-layered substrate 200C further includes a first back-side layer 232 formed on the back surface $205_2$ of the base layer 205. The first back-side layer 232 can be formed of a metallic material, such as titanium, tungsten, tantalum, nickel, iron, copper, aluminum, or alloys thereof or combinations thereof. In some embodiments, the first back-side layer 232 can be formed of a nitride, such as silicon nitride, titanium nitride, or tantalum nitride. In some embodiments, the first front-side layer 231 and the first back-side layer 232 can be formed of a same material. The first back-side layer 232 can have a thickness in the Z-direction from about 50 nm to about 1000 nm, such as from about 100 nm to about 500 nm.

The multi-layered substrate 200C can further include a second back-side layer 233 formed on the first back-side layer 232. For example, the second back-side layer 233 can be formed on the surface of the first back-side layer 232 facing away from the back-contact layer 120. The second back-side layer 233 can be formed of a metallic material, such as a metallic nitride, such as a silicon nitride, titanium nitride, or tantalum nitride. The second back-side layer 233 can have a thickness in the Z-direction from about 50 nm to about 1000 nm, such as from about 100 nm to about 500 nm.

The multi-layered substrate 200C having metallic layers (e.g., layers 231, 232) deposited on both sides of the base layer 205 can reduce the residual stress present in the base layer 205 during production and the useful life of the multi-layered substrate 200C. The reduction in residual stress of the base layer 205 can also increase the likelihood of forming a flat substrate, which can improve the quality of the layers of the photovoltaic device 110 subsequently deposited on the substrate. Having metallic layers formed on both sides of the base layer 205 also simplifies the reduction of residual stress in the base layer 205 relative to multi-layered substrates having metallic layers formed on only one side of the base layer 205.

Furthermore, having metallic layers on both sides of the polymer base layer 205, such as metallic barrier layers (e.g., titanium nitride) can help to reduce degassing from the base layer 205, such as degassing of organic molecules or water vapor during subsequent depositions, such as depositions of the layers in the photovoltaic device 110. The reduced degassing during the subsequent depositions can help to maintain the vacuum pressure at which certain deposition steps of the photovoltaic device 110 are carried out and can also help to improve the quality of the layers deposited because there is less degassed material to interfere with the deposition.

Furthermore, having metallic layers on both sides of the polymer base layer 205 increases the temperature at which subsequent depositions can be successfully performed, such as depositions of the layers of the photovoltaic device 110. For example, a multi-layered substrate having metallic layers formed on both sides of a polyimide base layer 205 can be used for depositions carried out at temperatures up to 500° C., which is not possible with a substrate formed only of polyimide. Furthermore, the multi-layered substrate having metallic layers formed on both sides of a polyimide base layer 205 maintains acceptable flexibility and an acceptable elastic modulus at temperatures up to 500° C., and does not show fatigue and similar defects that occur with metallic substrates (e.g., stainless steel) at temperatures around 500° C., such as temperatures within 25° C. of 500° C. As described below in reference to FIG. 3, the multi-layered substrates described herein can be formed using roll-to-roll processes, and the depositions of the layers of the photovoltaic device 110 can also be performed using roll-to-roll processes, so maintaining acceptable flexibility and an acceptable elastic modulus for the substrate can be particularly important due to the stresses placed on the substrate during these roll-to-roll processes. Thus, the multi-layered substrate 200C having metallic layers deposited on both sides of the polymer base layer 205 offers advantages relative to a polymer substrate as well as a metallic substrate.

Figure 2D:
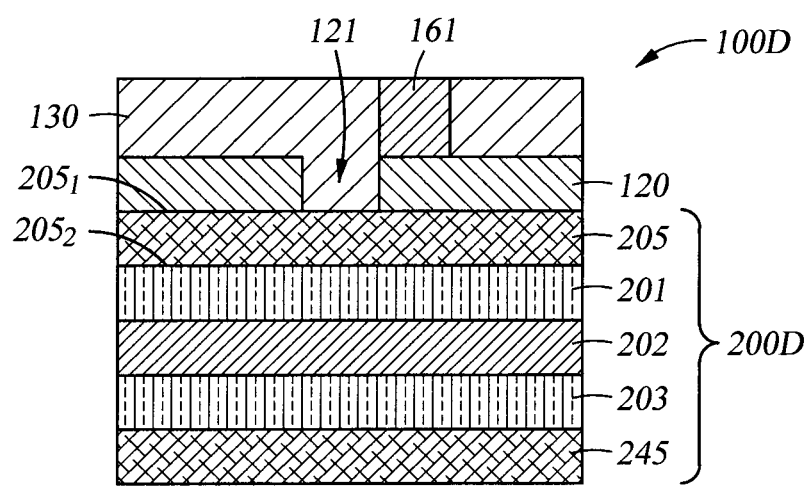
FIG. 2D is a partial cross sectional view of a photovoltaic apparatus, according to one embodiment.

FIG. 2D is a partial cross sectional view of a photovoltaic apparatus 100D, according to one embodiment. The photovoltaic apparatus 100D is similar to the photovoltaic apparatus 100 shown in FIG. 1A except that the photovoltaic apparatus 100D includes a multi-layered substrate 200D instead of the multi-layered substrate 200 described above. The dashed box 2A-2E shown in FIG. 1A provides an exemplary location for where the view shown in FIG. 2D could be taken on a photovoltaic apparatus including the multi-layered substrate 200D.

The multi-layered substrate 200D is the same as the multi-layered substrate 200 shown in FIG. 1A except that the multi-layered substrate 200D further includes a second base layer 245. The second base layer 245 can be formed on the third back-side layer 203. For example, the second base layer 245 can be formed on the surface of the third back-side layer 203 facing away from the back-contact layer 120.

The second base layer 245 can be formed of a flexible material, such as a flexible polymer, such as polyimide. However, in some embodiments the second base layer 245 can be formed of a different flexible material, such as a metallic layer, such as a metallic foil, such as a stainless steel foil. In some embodiments, the base layer 205 and the second base layer 245 can be formed of a same material, such as polyimide. The second base layer 245 can have a thickness in the Z-direction from about 2 µm to about 200 µm, such as from about 5 µm to about 100 µm.

The multi-layered substrate 200D having two polymer base layers 205, 245 can improve the electrical insulating properties of the multi-layered substrate 200D. Furthermore, the second polymer base layer 245, which can be softer than the metallic layers described herein, can help to prevent mechanical damage to the layers of the photovoltaic device 110 during the winding and unwinding that occurs during the roll-to-roll processes that can be used to produce the photovoltaic apparatuses described herein. Also, the higher emissivity of the second polymer base layer 245 relative to the metallic layers described herein, can facilitate improved temperature measurements of the multi-layered substrate, which can improve the temperature control during subsequent depositions resulting in improved product quality. Moreover, polymers, such as polyimide, are largely chemically inert to the materials used in the deposition of the layers of the photovoltaic device 110, so the second polymer base layer 245 can help to reduce the occurrence of deposition material reacting with a material on the surface of the multi-layered substrate, and thus product quality can be improved.

Figure 2E:
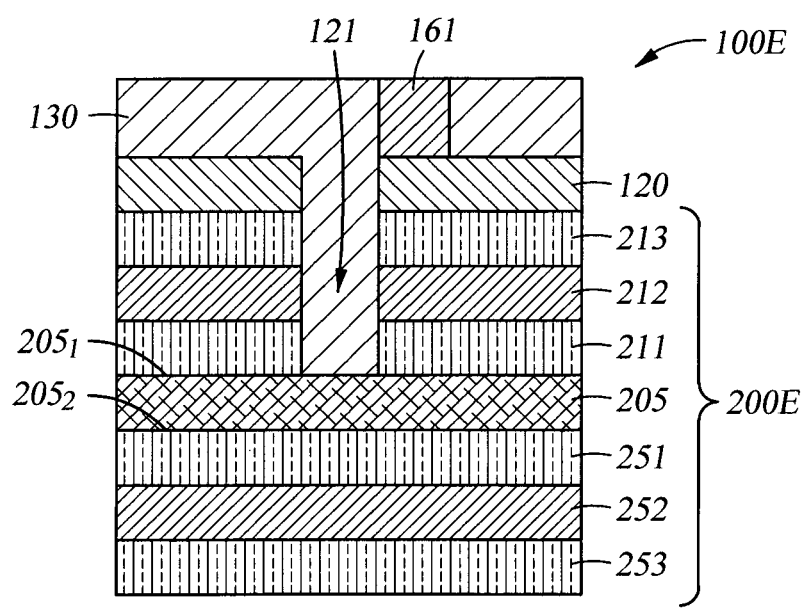
FIG. 2E is a partial cross sectional view of a photovoltaic apparatus 100E, according to one embodiment.

FIG. 2E is a partial cross sectional view of a photovoltaic apparatus 100E, according to one embodiment. The photovoltaic apparatus 100E is similar to the photovoltaic apparatus 100A shown in FIG. 2A except that the photovoltaic apparatus 100E includes a multi-layered substrate 200E instead of the multi-layered substrate 200A described above. The dashed box 2A-2E shown in FIG. 1A provides an exemplary location for where the view shown in FIG. 2E could be taken on a photovoltaic apparatus including the multi-layered substrate 200E.

The multi-layered substrate 200E is the same as the multi-layered substrate 200A shown in FIG. 2A except that the multi-layered substrate 200E further includes three back-side layers including a first back-side layer 251, a second back-side layer 252, and a third back-side layer 253. The first back-side layer 251 can be formed on the back surface $205_2$ of the base layer 205. The second back-side layer 252 can be formed on the first back-side layer 251. For example, the second back-side layer 252 can be formed on the surface of the first back-side layer 251 facing away from the back-contact layer 120. The third back-side layer 253 can be formed on the second back-side layer 252. For example the third back-side layer 253 can be formed on the surface of the second back-side layer 252 facing away from the back-contact layer 120.

The first back-side layer 251 can be formed of a same material as the first front-side layer 211. For example, in one embodiment, the first back-side layer 251 and the first front-side layer 211 are each formed of a metallic nitride, such as silicon nitride, titanium nitride, or tantalum nitride. The second back-side layer 252 can be formed of a same material as the second front-side layer 212. For example, in one embodiment, the second back-side layer 252 and the second front-side layer 212 are each formed of a metallic material, such as titanium, tungsten, tantalum, nickel, aluminum, copper, iron, or alloys thereof or combinations thereof. The third back-side layer 253 can be formed of a same material as the third front-side layer 213. For example, in one embodiment, the third back-side layer 253 and the third front-side layer 213 are each formed of a metallic nitride, such as silicon nitride, titanium nitride, or tantalum nitride.

Thus, layers of the same material can be formed in the same order in the direction away from the base layer 205 on both sides of the base layer 205, which can make the multi-layered substrate 200E substantially symmetrical on either side of the base layer 205. In some embodiments, the metallic layers formed of the same material on opposing sides of the base layer 205 can also have a same thickness in the Z-direction further increasing the symmetry of the multi-layered substrate 200E on opposing sides of the base layer 205. Forming metallic layers of a same material and in some embodiments of a same thickness on both sides of the base layer 205 can help reduce the residual stress in the base layer 205. In some embodiments, one or more of the metallic layers can be asymmetric from the corresponding layer of the same material on the opposing side of the base layer 205, such as having a different thickness. The asymmetry between the metallic layers on the opposing sides of the base layer 205 can also help reduce the changes in residual stress in the base layer 205 caused by the photovoltaic device 110 deposited on the multi-layered substrate. Although the multi-layered substrate 200E of FIG. 2E is described a modified version of the multi-layered substrate 200A, the other multi-layered substrates 200, and 200B-200D described above could also be similarly modified to have a symmetrical pattern of metallic layers formed on both sides of the base layer 205 in order to obtain benefits similar to the benefits described above in reference to multi-layered substrate 200E.

Figure 3:
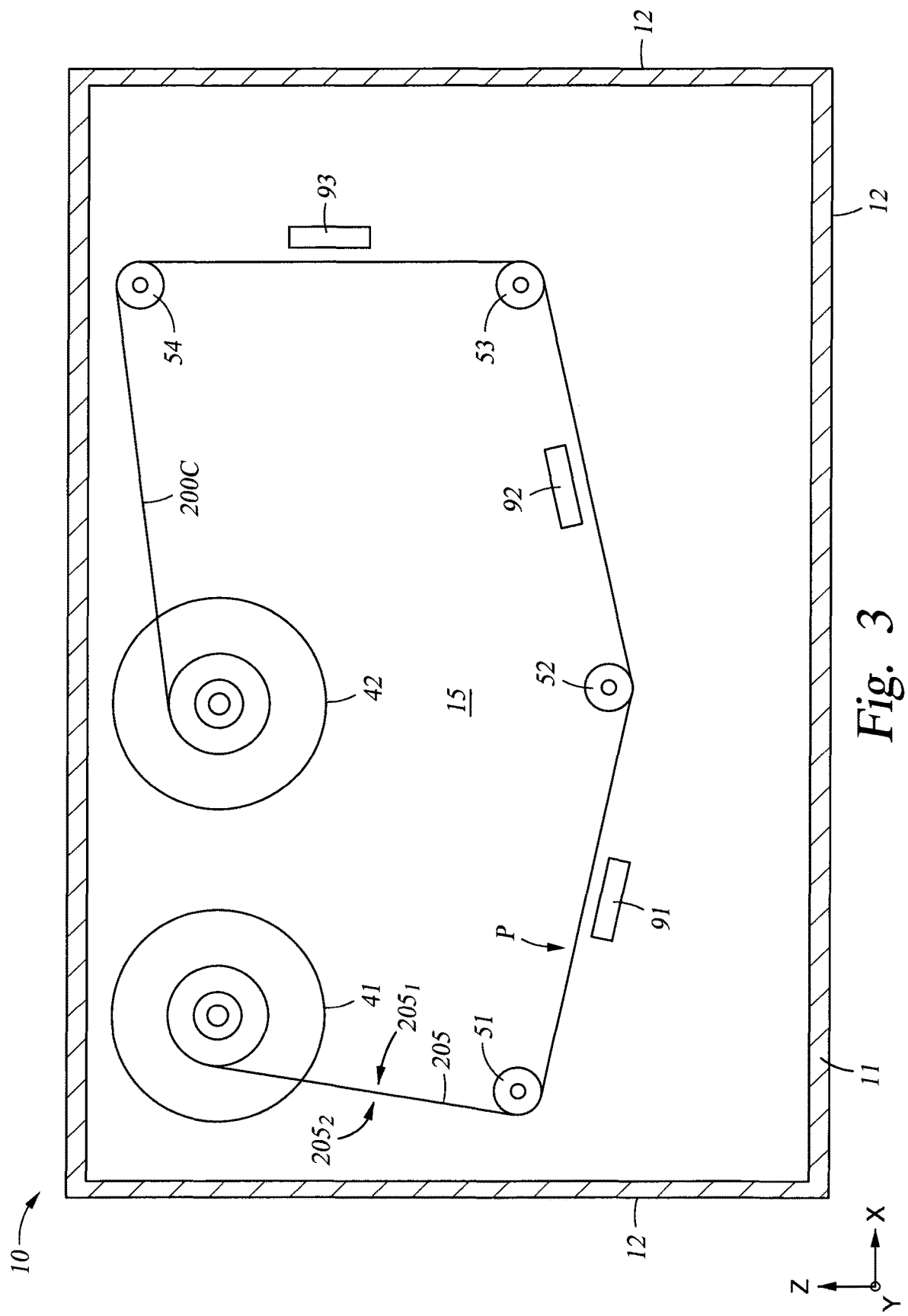
FIG. 3 is a side cross-sectional view of a deposition system that can be used to form the multi-layered substrate shown in FIG. 2C, according to one embodiment.

FIG. 3 is a side cross-sectional view of a deposition system 10 that can be used to form a multi-layered substrate, such as the multi-layered substrate 200C of FIG. 2C described above, according to one embodiment. While not intending to limit the scope of the disclosure provided herein, in one embodiment, the deposition system 10 is a roll-to-roll type deposition system for depositing material layers onto the base layer 205 described above. The deposition system 10 includes a vacuum chamber 11 including one or more walls 12 for enclosing a processing region 15 of the deposition system 10. In the deposition system 10, the base layer 205 can be transferred along a path P through the processing region 15 from a feed roll 41, over tensioning rolls 51, 52, 53, 54 and to a take-up roll 42. The path P is described as beginning at the feed roll 41 and ending at the take-up roll 42, where the length of the path is formed by the unwound base layer 205 that extends from the feed roll 41 to the take-up roll 42. Locations on or proximate to the path P that are further from the feed roll 41 than other locations on or proximate to the path P are to the feed roll 41 are referred to as being located further down the path P. For example, the tensioning roll 52 is located further down the path P than the tensioning roll 51.

The deposition system 10 can further include a first sputtering source 91, a second sputtering source 92 and a third sputtering source 93, which can all be both disposed within the processing region 15. The first sputtering source 91 can be located on a back surface side of the unwound base layer 205. The second sputtering source 92 can be located on the front surface side of the unwound base layer 205. In some embodiments, the second sputtering source 92 can be located further down the path P than the first sputtering source 91. The third sputtering source 93 can be located on a back surface side of the unwound base layer 205. In some embodiments, the third sputtering source 93 can be located further down the path P than the first and second sputtering sources 91, 92.

The sputtering sources 91-93 can be used to deposit material layers onto the base layer 205 in order to transform the base layer 205 into the multi-layered substrate 200C. For example, the first sputtering source 91 can be used to deposit the first back-side layer 232 (e.g., a titanium layer) onto the back surface $205_2$ of the base layer 205. The second sputtering source 92 can be used to deposit the first front-side layer 231 (e.g., a titanium layer) onto the front surface $205_1$ of the base layer 205. The third sputtering source 93 can be used to deposit the second back-side layer 233 (e.g., a titanium nitride layer) onto the first back-side layer 232.

A person of ordinary skill in the art will recognize that any appropriate material may be deposited on a substrate using the deposition system 10. The deposition system 10 is particularly appropriate for deposition of materials to create multi-layered substrates, such as the multi-layered substrates 200, 200A-200C, and 200E described above. For multi-layered substrates including more than three layers deposited onto the base layer 205, such as the multi-layered substrate 200B, additional sputtering sources (not shown) can be disposed in a vacuum chamber similar to the vacuum chamber 11 described above. For multi-layered substrates including a second polymer base layer, such as the multi-layered substrate 200D, the second base layer can be coated onto the metallic base layers. For example, for the multi-layered substrate 200D, the second base layer 245 can be coated onto the third back-side layer 203.

Figure 4:
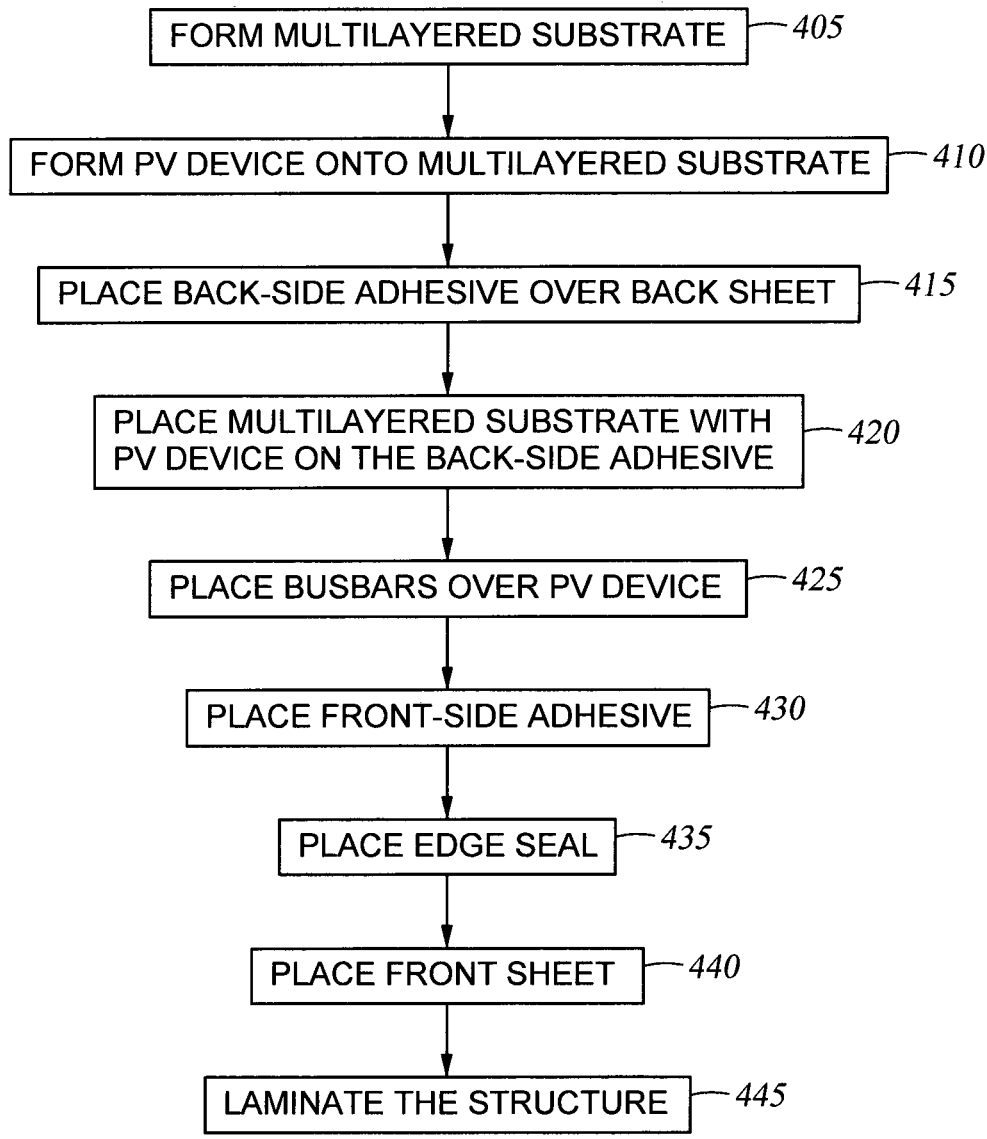
FIG. 4 is a process flow diagram of a method 400 for forming the photovoltaic apparatus shown in FIG. 2C, according to one embodiment.

FIG. 4 is a process flow diagram of a method 400 for forming the photovoltaic apparatus 100C, according to one embodiment. Referring to FIGS. 1A, 2C, 3, and 4 the method 400 is described. At block 405, the multi-layered substrate 200C is formed. For example, the multi-layered substrate 200C can be formed using the deposition system 10 as described above in reference to FIG. 3.

At block 410, the photovoltaic device 110 is formed on the multi-layered substrate 200C. In one embodiment, the back-contact layer 120 is formed over the first front-side layer 231. Then the absorber layer 130 can be deposited over the back-contact layer 120. Next, the optional semiconductive buffer layer 140 can be formed over the absorber layer 130. Then the front-contact layer 150 can be formed over the absorber layer 130 or the semiconductive buffer layer 140 if included. Next, one or more scribing steps are then performed on the deposited layers to form interconnected photovoltaic cells 112 of the photovoltaic device 110. For example, the back contact layer 120 and any metallic layers on the front-side of the base layer 205 can be scribed, so that the individual photovoltaic cells can be formed. In some embodiments, a laser scribing process can be performed to form the back contact groove 121 once the back contact layer 120 is deposited. Furthermore, in some embodiments that include metallic layers formed on both sides of the base layer 205, the front-side metallic layers and the back contact layer 120 can first be deposited, then the back contact groove 121 can be formed using the laser scribing process, and then the back-side metallic layers can be deposited on the back side of the base layer 205.

At block 415, the back-side adhesive 101B is placed on the back sheet 105. At block 420, the photovoltaic device 110 supported by the multi-layered substrate 200C is placed on the back-side adhesive 101B. For example, the second back-side layer 233 of the multi-layered substrate 200 C can be placed on the back-side adhesive 101B.

At block 425, the busbars 181, 182 can be placed over the photovoltaic device 110, for example at the locations shown in FIG. 1A. At block 430, the front-side adhesive 101A can be placed over the photovoltaic device 110, over the busbars 181, 182, and over the back-side adhesive 101B. At block 435, the edge seal 160 can be placed on the back sheet 105 and around the front-side adhesive 101A and the back-side adhesive 101B.

At block 435, the front sheet 170 is placed over the front-side adhesive 101A and over the edge seal 160. At block 440, the structure including the back sheet 105, the front sheet 170, and all components between the back sheet 105 and the front sheet 170 can be laminated together to form the photovoltaic apparatus 100C.

While the foregoing is directed to embodiments of the present disclosure, other and further embodiments of the disclosure may be devised without departing from the basic scope thereof, and the scope thereof is determined by the claims that follow.

What is claimed is:

1. A photovoltaic apparatus, comprising:
   a photovoltaic device including an array of photovoltaic cells, each photovoltaic cell comprising a back-contact layer, a front-contact layer, and an absorber layer disposed between the front-contact layer and the back-contact layer; and
   a multi-layered substrate comprising:
      a base layer formed of a polymer, the base layer having a front surface facing the photovoltaic device and an opposing back surface facing away from the photovoltaic device, wherein the photovoltaic device is disposed over the front surface of the multi-layered substrate; and
      a plurality of metallic layers, wherein the base layer is disposed between the photovoltaic device and at least one of the plurality of metallic layers,
      wherein the plurality of metallic layers comprises:
         a first layer disposed on the opposing back surface of the base layer, the first layer formed of titanium nitride,
         a second layer disposed on the first layer, wherein the second layer is formed of titanium, and
         a third layer disposed on the second layer, wherein the third layer is formed of titanium nitride.

2. The photovoltaic apparatus of claim 1, wherein the base layer is formed of polyimide.

3. The photovoltaic apparatus of claim 1, further comprising an additional base layer disposed on the third layer, wherein the base layer and the additional base layer are each formed of polyimide.

4. The photovoltaic apparatus of claim 1, wherein the back-contact layer of each of the array of the photovoltaic cells is disposed on the front surface of the base layer and the back-contact layer of each of the array of the photovoltaic cells is formed of molybdenum.

5. The photovoltaic apparatus of claim 1, wherein the plurality of or more metallic layers further comprises:
   a fourth layer disposed on the third layer, wherein the fourth layer is formed of titanium, and
   a fifth layer disposed on the fourth layer, wherein the fifth layer is formed of titanium nitride.

6. The photovoltaic apparatus of claim 1, wherein the plurality of more metallic layers comprises:
   a fourth layer disposed on the front surface of the base layer;
   a fifth layer disposed on the fourth layer; and
   a sixth layer disposed on the fifth layer.

7. The photovoltaic apparatus of claim 6, wherein
   the fourth layer is formed of a same titanium nitride as the first layer;
   the fifth layer is formed of a same titanium as the second layer; and
   the sixth layer is formed of a same titanium nitride as the third layer.

8. The photovoltaic apparatus of claim 7, wherein
   the first layer has a same thickness in a direction towards the base layer as the fourth layer;
   the second layer has a same thickness in a direction towards the base layer as the fifth layer; and
   the third layer has a same thickness in a direction towards the base layer as the sixth layer.

9. A photovoltaic apparatus, comprising:
   a photovoltaic device including an array of photovoltaic cells, each photovoltaic cell comprising a back-contact layer, a front-contact layer, and an absorber layer disposed between the front-contact layer and the back-contact layer; and
   a multi-layered substrate comprising:
      a first base layer formed of a polymer, the first base layer having a first front surface facing the photovoltaic device and a first opposing back surface facing away from the photovoltaic device, wherein the photovoltaic device is disposed over the first front surface of the multi-layered substrate; and
      a plurality of metallic layers comprising:
         a first front-side layer, wherein the front-side layer is disposed between the photovoltaic device and the first base layer;
         a first back-side layer disposed between the first opposing back surface and a second back-side layer, the first back-side layer is formed of titanium nitride and the second back-side layer is formed of titanium; and
         a third back-side layer disposed on the second back-side layer, the third back-side layer is formed of titanium nitride.

10. The photovoltaic apparatus of claim 9, further comprising:
    a second base layer, the second base layer having a second front surface facing the photovoltaic device and a second opposing back surface,
    wherein the first, the second and the third back-side layers are disposed between the first base layer and the second front surface of the second base layer.

11. The photovoltaic apparatus of claim 1, wherein the third metallic layer is in contact with a polymeric encapsulation layer.

12. The photovoltaic apparatus of claim 11, wherein the apparatus further comprises a back sheet comprising a flexible material.

13. The photovoltaic apparatus of claim 12, wherein the back sheet comprises polyethylene terephthalate (PET), polyvinylidene fluoride (PVDF), or copolymers, such as fluoroethylene/vinyl ether (FEVE).

14. The photovoltaic apparatus of claim 1, wherein one of the plurality of metallic layers is electrically connected to the back contact layer, wherein the electrical connection is configured to prevent the one or more metallic layers from accumulating a floating potential.

* * * * *